United States Patent
Guedon et al.

(10) Patent No.: US 8,705,217 B2
(45) Date of Patent: Apr. 22, 2014

(54) ELECTROSTATIC DISCHARGE PROTECTION CIRCUIT

(75) Inventors: Yannick Guedon, Singapore (SG);
Meiliana Leow, Singapore (SG);
Sze-Kwang Tan, Singapore (SG);
Mariano Dissegna, Freising (DE);
Lorenzo Cerati, Cinisello Balsamo (IT)

(73) Assignee: STMicroelectronics Asia Pacific Pte Ltd, Singapore (SG)

( * ) Notice: Subject to any disclaimer, the term of this patent is extended or adjusted under 35 U.S.C. 154(b) by 1167 days.

(21) Appl. No.: 12/343,746

(22) Filed: Dec. 24, 2008

(65) Prior Publication Data
US 2010/0157493 A1    Jun. 24, 2010

(51) Int. Cl.
*H02H 9/00*    (2006.01)

(52) U.S. Cl.
USPC .......................................................... 361/56

(58) Field of Classification Search
USPC .......................................................... 361/56
See application file for complete search history.

(56) References Cited

U.S. PATENT DOCUMENTS

| | | | | |
|---|---|---|---|---|
| 5,745,323 | A * | 4/1998 | English et al. | 361/56 |
| 6,624,992 | B1 * | 9/2003 | Aparin | 361/56 |
| 2001/0013810 | A1 * | 8/2001 | Tsukagoshi et al. | 330/253 |
| 2002/0140489 | A1 * | 10/2002 | Maloney et al. | 327/310 |
| 2003/0016480 | A1 * | 1/2003 | Arai et al. | 361/56 |
| 2004/0160717 | A1 * | 8/2004 | May et al. | 361/91.5 |
| 2004/0232980 | A1 * | 11/2004 | Jantzi et al. | 330/51 |
| 2006/0158802 | A1 * | 7/2006 | Kawashimo et al. | 361/56 |
| 2007/0057327 | A1 | 3/2007 | Chen | |

\* cited by examiner

*Primary Examiner* — Jared Fureman
*Assistant Examiner* — Nicholas Ieva
(74) *Attorney, Agent, or Firm* — Gardere Wynne Sewell LLP

(57) ABSTRACT

An integrated circuit includes an electrostatic discharge (ESD) detection circuit which detects an ESD event and generates an event signal. In response to that event signal, a control circuit controls the operation of a buffer circuit to function in an additional mode wherein the normal differential operation of the buffer circuit is disabled and the buffer circuit is instead configured to form a conduction path between supply rails to discharge the ESD event. Preferably, a plurality of buffer circuits are driven in parallel by the control circuit to function in the additional mode to form parallel discharge paths for the ESD event. Multiple ESD detection circuits may be provided, and any one of those detection circuits can trigger the control circuitry to place all of the buffer circuits in the additional mode.

9 Claims, 4 Drawing Sheets

US 8,705,217 B2

ELECTROSTATIC DISCHARGE PROTECTION CIRCUIT

FIELD OF THE INVENTION

The invention relates to electronic circuits, and more particularly the invention relates to an electrostatic discharge protection circuit utilizing output buffers.

BACKGROUND OF THE INVENTION

Electrostatic discharge (ESD) protection circuits are commonly used to protect Liquid Crystal Display (LSD) column drivers and other integrated circuits from damage due to electrostatic discharge. FIG. 1 illustrates an existing ESD protection circuit 100 for a column driver integrated circuit 104 of a typical LCD. The column driver integrated circuit 104 includes a plurality of output buffers 108-132. The output buffers 108-132 each formed by a CMOS pair of transistors are coupled to a pair of diodes. For example, the output buffer 108 includes PMOS transistor 140 and NMOS transistor 142 coupled in series between a voltage rail 134 and ground 136. A diode 144 is connected in parallel to the transistor 140 and a diode 146 is connected in parallel to the transistor 142. The diodes 144 and 146 each may be internal diodes or body diodes of the respective transistor 140 and 142 or they may by dedicated components. A pad 110 (i.e., node 110) is coupled at the common drains of the transistors 140 and 142. As is known to those skilled in the art, an electrostatic discharge (ESD) event originating outside can pass through the pads 110 into the integrated circuit. Each of the output buffers 108-132 typically have a similar configuration. The integrated circuit further has an ESD protection circuit 100 in the form of at least one (two are illustrated) clamp circuits 150 and 154 each coupled between the voltage rail 134 and ground rail 136. The clamp circuits 150 and 154 are used to limit the ESD induced voltage to a safe value to protect the integrated circuit.

FIG. 2 illustrates a circuit configuration for one of the clamp circuits, for example, clamp circuit 154, in further detail. The clamp circuit 154 generally includes an electrostatic detection circuit (EDC) 156 whose output drives the operation of a clamp transistor 220. The EDC 156 includes an R-C network 202 formed by a resistor 204 and a capacitor 208 coupled in series between the voltage rail 134 and ground rail 136 of the integrated circuit 104. The EDC 156 also includes an PMOS-type transistor 212 whose source/drain circuit is coupled in series with a resistor 216 between the voltage rail 134 and ground rail 136. The transistor 212 has a gate terminal 210 to which is coupled to a node of the R-C network 202 located between the series connected resistor 204 and capacitor 208. The clamp transistor 220 may be an NMOS-type transistor whose source/drain circuit is coupled between the voltage rail 220 and ground rail 136. The clamp transistor 220 has a gate terminal 222 which is coupled to a node 214 which is located between the drain of transistor 212 and the resistor 216.

Operation of the circuit will now be described. During an ESD event at the voltage rail 134 (i.e., a sharp rise in voltage on the rail 134), the R-C network 202 causes the gate of the transistor to go to the ground rail 136 and this turns ON the PMOS transistor 212, thereby causing current to flow through the resistor 216. As a consequence, a voltage is developed across the resistor 216 causing a rise in voltage at the gate of the clamp transistor 220. This causes the clamp transistor to turn ON very hard, essentially shorting the source/drain circuit and sinking the ESD event to the ground rail 136. As is well known to those skilled in the art, the clamp transistor 220 is a very large device and thus utilizes a significant amount of die area on the integrated circuit 104. For example, a clamp transistor may have a width between 2 mm to 15 mm.

FIG. 3 illustrates a layout of a column driver integrated circuit 300 on a rectangular die 304. The column driver integrated circuit 300 includes a plurality of output buffers 308A-308N coupled between a voltage rail 320 and ground rail 324. The output buffers 308A-308N are laid out near the periphery of the die 304. Clamp circuits 330 and 334 are each coupled between the voltage rail 320 and ground rail 324 and are placed near the center of the die 304. The clamp circuits 330 and 334 each include an EDC circuit 156 and a clamp transistor 220 (shown in FIG. 2). As illustrated in FIG. 3, the clamp circuits 330 and 334 occupy more space on the die relative to the output buffers 308A-308N because the clamp transistors require significant amount of die area.

As the size of an LCD increases, the number of output buffers increase correspondingly, thus requiring longer leads for the voltage rail 320 and ground rail 324 which degrade the performance of the clamp circuits 330 and 334. Existing solutions have proposed adding additional clamp circuits across the die, connecting power lines through the center of the die and/or adding a clamp transistor to each output buffer. FIG. 4 illustrates an existing solution implemented in a column driver 400 on a die 404. The column driver 400 includes output buffers 408A-408N each coupled between a voltage rail 420 and ground rail 424. Six clamp circuits 430, 434, 438, 442, 446 and 452 are coupled between the voltage rail 420 and ground rail 424 to provide ESD protection. Also, the voltage rail 420 and ground rail 424 are extended to pass through the center of the die. It will be appreciated that the existing solution requires additional clamp circuits which increases the die size.

SUMMARY

In an embodiment, a circuit comprises: a CMOS output buffer coupled between a first supply rail and a second supply rail; an ESD detection circuit coupled to detect an ESD event and generate an event signal; and a control circuit responsive to the event signal for activating the CMOS output buffer to connect the first supply rail to the second supply rail to discharge the ESD.

In another embodiment, a circuit comprises: a plurality of CMOS output buffers coupled between a first supply rail and a second supply rail; an ESD detection circuit coupled to detect an ESD event and generate an event signal; and a control circuit responsive to the event signal for simultaneously activating all of the CMOS output buffers to connect the first supply rail to the second supply rail to discharge the ESD.

In another embodiment, a circuit comprises: a plurality of CMOS output buffers coupled between a first supply rail and a second supply rail; a plurality of ESD detection circuits each coupled to detect an ESD event and generate an event signal; and a control circuit responsive to the event signal from any one of the plurality of ESD detection circuits for simultaneously activating all of the CMOS output buffers to connect the first supply rail to the second supply rail to discharge the ESD.

In another embodiment, a circuit comprises: a CMOS buffer circuit having a connection to a pad and comprising a first transistor and a second transistor whose source/drain circuits are coupled in series between a first supply rail and a second supply rail; an ESD detection circuit coupled to detect an ESD event and generate an event signal; and a control circuit responsive to the event signal for simultaneously activating both the first transistor and the second transistor so that the series connected source/drain circuits form a conduction path between the first supply rail to the second supply rail to discharge the ESD event.

BRIEF DESCRIPTION OF THE DRAWINGS

For a more complete understanding of the features, example embodiments and possible advantages of the present invention, reference is now made to the detailed description of the invention along with the accompanying figures and in which.

DETAILED DESCRIPTION OF THE DRAWINGS

This disclosure incorporates by reference for all purposes U.S. Patent Application Publication No. 2007/0057327, entitled "LCD SOURCE DRIVER FOR IMPROVING ELECTROSTATIC DISCHARGE."

Figure 5:
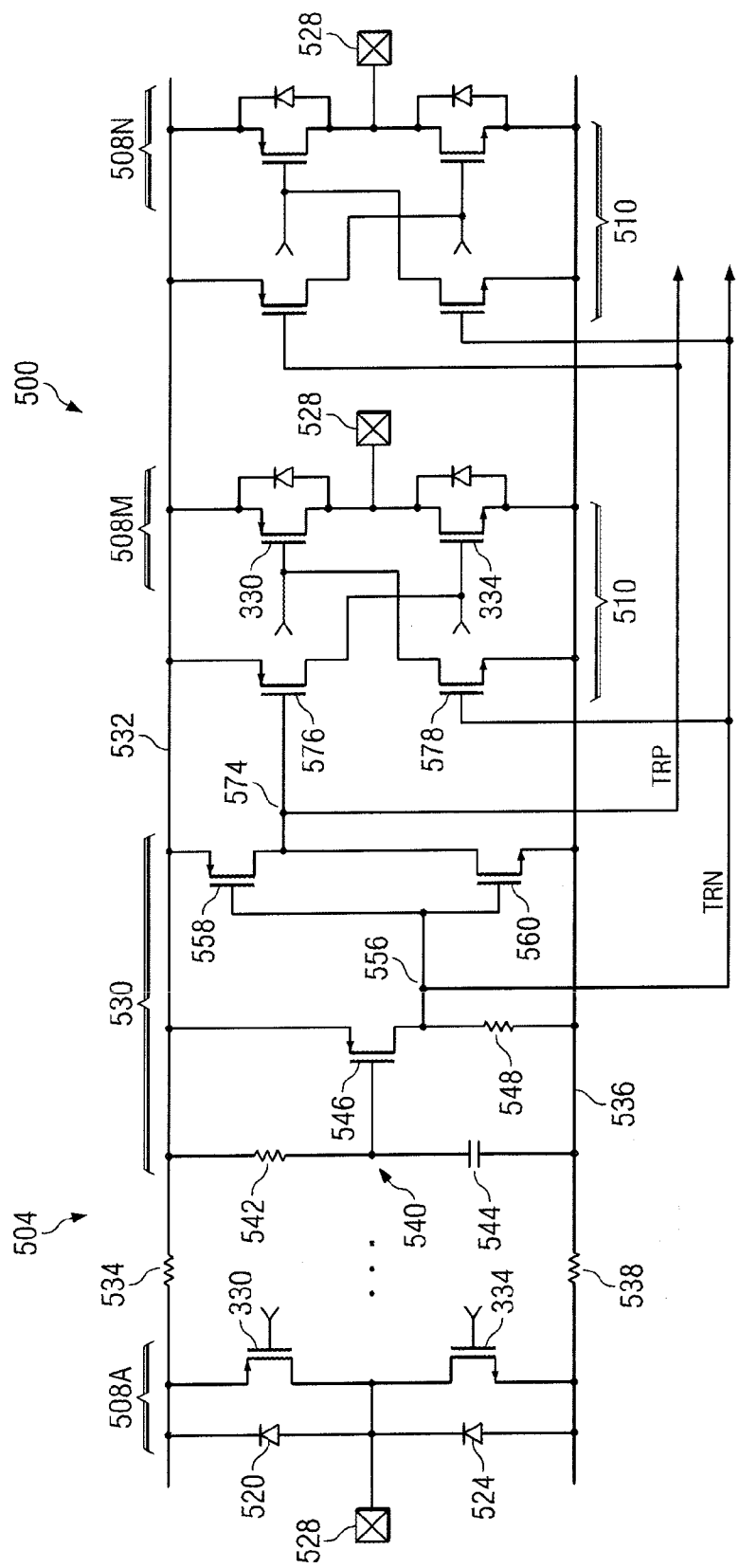
FIG. 5 illustrates an ESD protection circuit in accordance with an example embodiment.

FIG. 5 illustrates an ESD protection circuit 500 in accordance with an example embodiment. In one implementation, the ESD protection circuit 500 is used to protect a column driver integrated circuit 504 of an LCD. In FIG. 5, the ESD protection circuit 500 is implemented to protect the integrated circuit which includes a plurality of output buffers (508A-508N). Each output buffer 508 includes a PMOS transistor 330 and an NMOS transistor 334 whose source/drain circuits are coupled in series between a voltage rail 532 and ground rail 536. Associated with these transistors are diodes 520 and 524 coupled between the voltage rail 532 and ground rail 536. The diodes 520 and 524 may be body diodes implemented internally within the transistors 512 and 516 or the diodes 520 and 524 or may be implemented as discrete components. A pad 528 (i.e., node) is coupled to the common drains of the transistors 330 and 334. This pad 528 may, as is known in the art, be an instigation point for an electrostatic discharge (ESD) event. The resistors 534 and 538 represent line impedances of the respective voltage rail 532 and ground rail 536.

When an ESD event occurs, the diode 520, for example, transfers the resulting high voltage to the voltage rail 532. The high voltage then travels through the voltage rail 532 until it reaches the nearest ESD detection circuit (e.g., ESD detection circuit 530).

The ESD detection circuit 530 includes an R-C network 540 coupled between the voltage rail 532 and rail ground 536. In one embodiment, the R-C network 540 is implemented with a resistor 542 and a capacitor 544 coupled between the voltage rail 532 and ground rail 536.

The ESD detection circuit 530 also includes a PMOS transistor 546 whose source/drain circuit is coupled in series with a resistor 548 coupled in series between the voltage rail 532 and ground rail 536. The transistor 546 includes a gate terminal 550 which is coupled to a node intermediate of the resistor 542 and capacitor 544 of the R-C network 540. The use of a PMOS-type transistor in this configuration is exemplary, it being understood that other transistor types can be used. In response to an ESD event causing the voltage on rail 532 to rise sharply, the R-C network 540 lowers the voltage on the gate of transistor 546 towards the ground rail 536 causing the transistor 546 to turn ON. A first event signal (TRN) is generated at node 556.

The ESD detection circuit 530 also includes CMOS transistors 558 and 560 connected to form a conventional CMOS inverter. Thus, the source/drain circuits of transistors 558 and 560 are connected in series between the voltage rail 532 and ground rail 536. An input to the inverter is formed by the commonly coupled gates of transistors 558 and 560 to the node 556. An output of the inverter is formed at the common drains of the transistors 558 and 560. Thus, in the exemplary implementation, the transistor 558 is a PMOS-type transistor and the transistor 560 is an NMOS-type transistor. The CMOS inverter formed by transistors 558 and 560 receives the first event signal TRN at their commonly coupled gate terminals, inverts the first event signal (TRN), and generates a second event signal (TRP) at node 574. Thus, the first event signal TRN and the second event signal TRP are complementary to each other.

The integrated circuit 504 further includes a plurality of ESD protection circuits 510 Each ESD protection circuit comprises a PMOS transistor 576 whose source is coupled to the voltage rail 532. The transistor 576 has a gate terminal which receives the second event signal TRP. The ESD protection circuit 510 further includes an NMOS transistor 578 whose source is coupled to the ground rail 536. The transistor 578 has a gate terminal which receives the first event signal TRN. The drain of transistor 576 is connected to the gate of the low side drive transistor 334 in the output buffer 508. The drain of transistor 578 is connected to the gate of the high side drive transistor 330 in the output buffer 508. The symbol < or > at the gates of the transistors 330 and 334 indicate that the output buffer 508 receives control or drive signals relating to conventional buffer operation from another part of the integrated circuit (see, discussion below). The transistors 576 and 578 function to over-ride normal buffer operation with respect to transistors 330 and 334, and instead cause these transistors 330 and 334 to function as part of the ESD protection circuit 510. Thus, the transistors 330 and 334 have a dual role in the operation of the circuit. In an ESD protection mode, the transistors 576 and 578 cause transistors 330 and 334 to simultaneously turn ON for the purpose of clamping the ESD event. If there is no ESD event to address, the transistors 576 and 578 are OFF, and this allows the transistors 330 and 334 to function in a normal buffer mode responsive to signals received at their respective gate terminals (< and >). It will be noted that a set of transistors 576 and 578, coupled to receive the signals TRN and TRP, are provided with respect to each of the buffers 508. Thus, each buffer on the integrated circuit is capable of dual mode operation.

In operation, when the first event signal TRN produces a high voltage at node 556, the transistor 578 turns ON, causing the transistor 330 of the output buffer 508 also turn on. Likewise, when the second event signal TRP produces a low voltage at node 574, the transistor 576 turns ON, causing the transistor 334 of the output buffer 508 also turn on. Because inverter transistors 558 and 560 produce TRN and TRP as complementary signals, when an ESD event is detected both of transistors 330 and 334 will be ON, thus forming a shunt connection between rail 532 and rail 536 through their series connected source/drain circuits.

Figure 1:
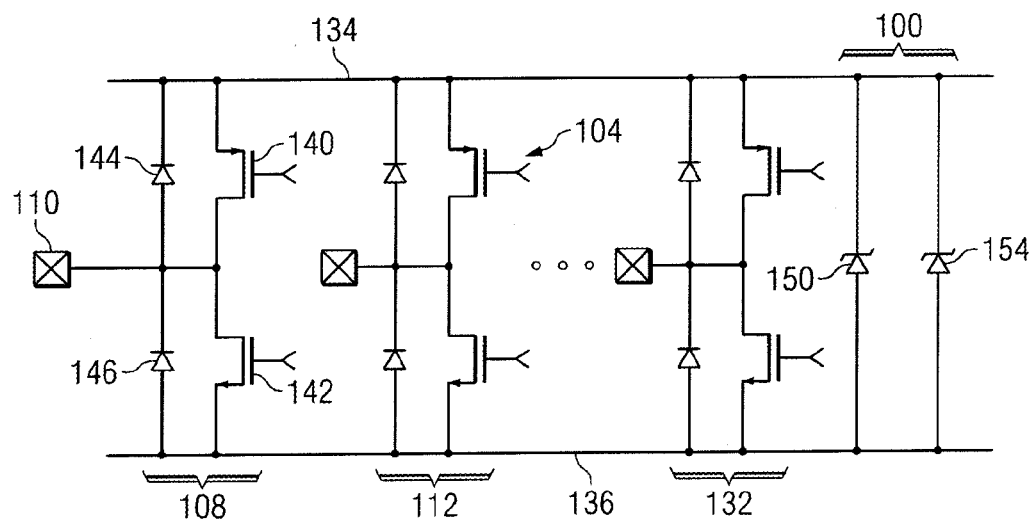
FIG. 1 illustrates an existing ESD protection circuit for an integrated circuit.
Figure 2:
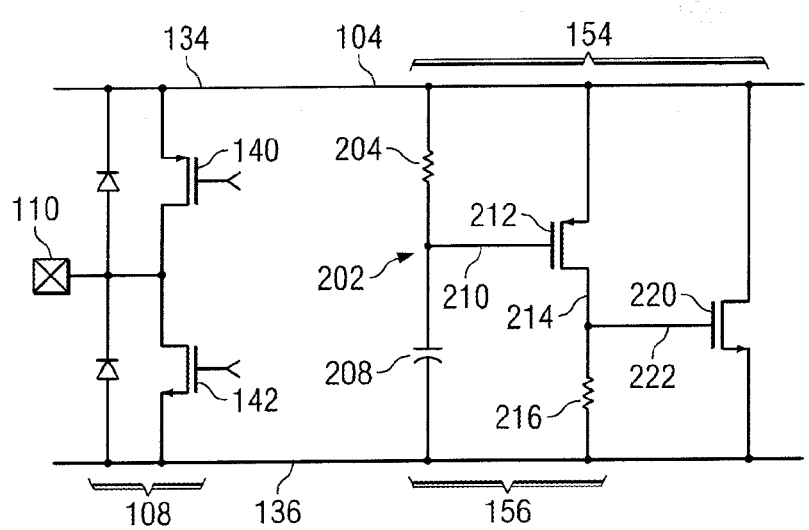
FIG. 2 illustrates a circuit configuration for one of the clamp circuits.
Figure 3:
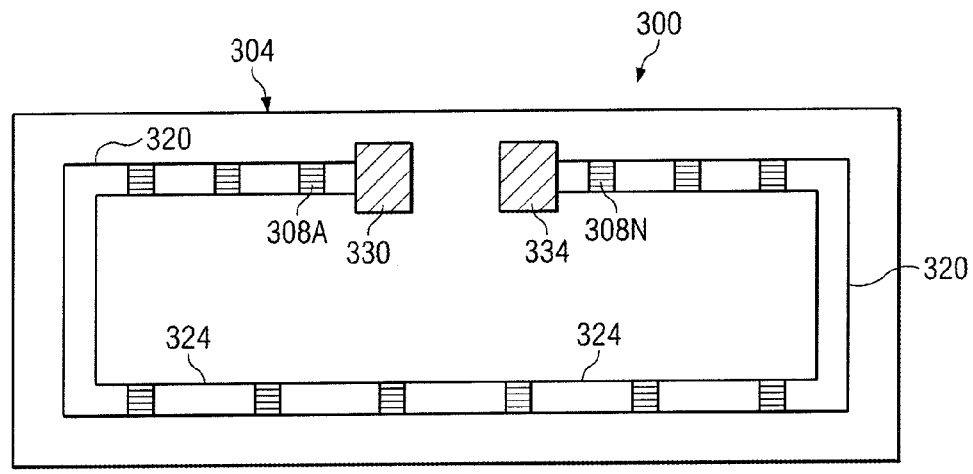
FIG. 3 illustrates a layout of an integrated circuit (including the buffer and clamp circuits of FIGS. 1 and 2) on a rectangular die.
Figure 4:
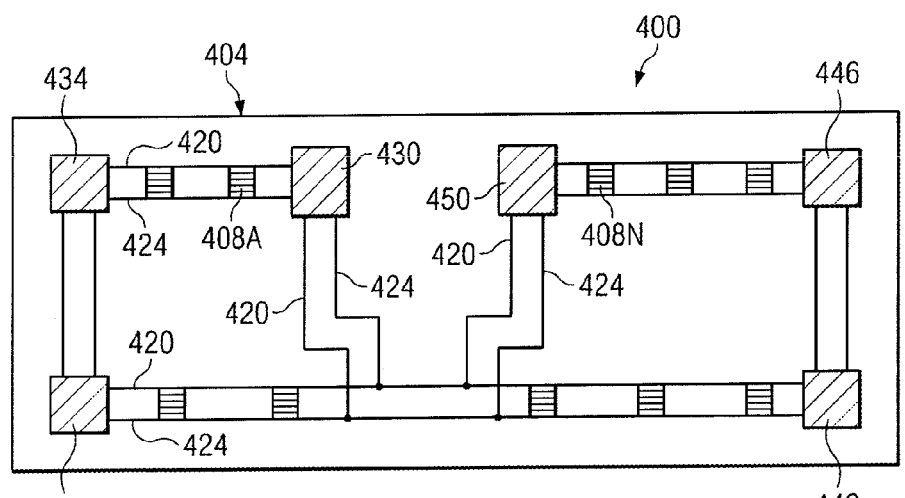
FIG. 4 illustrates an alternative layout of an integrated circuit (including the buffer and clamp circuits of FIGS. 1 and 2) on a rectangular die.

Reference is now once again made to FIG. 2. It will be remembered that clamp transistor 220 is a large device because of the amount of current that needs to be sunk during an ESD event. In FIG. 5, the buffer transistors 330 and 334 will be much smaller devices than the transistor 220. These smaller devices typically cannot handle the current and voltage of an ESD event on their own. Thus, the integrated circuit of FIG. 5 advantageously utilizes a plurality of buffer transistors in connection with the additional ESD protection mode. It will be noted that the signals TRP and TRN are applied to each buffer circuit 508, wherein each buffer circuit includes transistors 576 and 578 as control transistors with respect to implementing the ESD protection mode. The collection of buffer transistors 330 and 334, operated simultaneously in ESD protection mode in response to signals TRN and TRP, form a plurality of parallel clamp circuits to connect rail 532 to rail 536 during the ESD event.

The number of buffers 508 which additionally function as ESD protection circuits 510 may be selected by the circuit designer. In one implementation, all included buffers 508 will additionally function as ESD protection circuits 510. In another implementation, a number of buffers 508 less than all of the included buffers will additionally function as ESD protection circuits 510. In another implementation, multiple discrete sets of buffers 508 will additionally function as ESD protection circuits 510, such that different ESD protection zones are provided on the integrated circuit.

Although only a single ESD detection circuit 530 is shown in FIG. 5, it will be understood that, depending on the size of the integrated circuit, more than one ESD detection circuit 530 may be included on the integrated circuit. Preferably, the ESD detection circuits 530 are spread out over the integrated circuit. In any event, it is preferred that the plural ESD detection circuits 530 work in cooperation with each other. Thus, the TRP and TRN signals output from each included ESD detection circuit 530 are connected to each other and to all of the included ESD protection circuits 510. The arrows associated with the TRP and TRN signals in FIG. 5 are provided to designate, not only that the TRN and TRP signals are provided to more buffers 508 than those illustrated, but also that TRN and TRP signals can be generated by other ESD detection circuits not illustrated and located elsewhere on the integrated circuit. Thus, the detection of an ESD event by any one of the included ESD detection circuits 530 will cause a clamping operation to be performed by all of the connected ESD protection circuits 510.

Thus, it will be appreciated the ESD protection circuit 510 advantageously utilizes existing transistors 330 and 334 of each output buffer 508. The ESD protection scheme in accordance with the embodiment eliminates the need for a large transistor in order to sink the ESD. Alternatively, the ESD protection circuit 510 can be provided to supplement the protection provided by a conventional circuit like that shown in FIG. 2.

Figure 6:
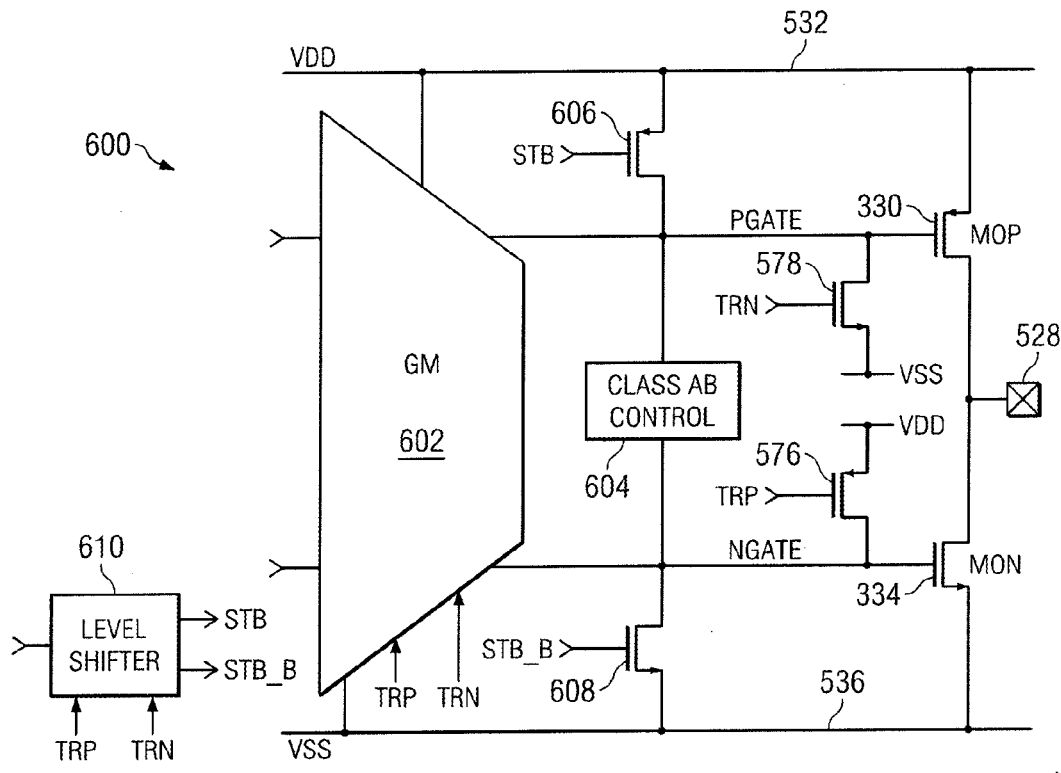
FIG. 6 illustrates an example output buffer.

FIG. 6 illustrates an example of a complete output buffer circuit 600 which includes the buffer transistors 330 and 334 as previously described. The FIG. 6 illustration accordingly provides an example of the circuitry used to drive the operation of the buffer transistors 330 and 334 in a normal buffer mode (see signals received at the respective gate terminals < and >). The buffer circuit 600 further includes a transconductance amplifier 602 with differential output applied to the gates of transistors 330 and 334. Coupled between those differential outputs is a Class AB control stage 604 as known in the art. To support a standby mode of operation, the circuit 600 further includes a pair of standby transistors 606 and 608. Transistor 606 is a PMOS transistor whose source/drain circuit is coupled between the rail 532 and the gate of buffer transistor 330. The gate of transistor 606 receives a standby signal STB. Transistor 608 is an NMOS transistor whose source/drain circuit is coupled between the rail 536 and the gate of buffer transistor 334. The gate of transistor 608 receives a standby signal STB_B, which is complementary to the signal STB. In normal operation, the transistors 606 and 608 are off, thus allowing the differential output of amplifier 602 to drive the gates of transistors 330 and 334. In standby mode, the transistors 606 and 608 are on, thus serving to force transistors 330 and 334 to be turned off by applying supply and ground voltages to the gates of transistors 330 and 334, respectively.

FIG. 6 further shows the presence of transistors 576 and 578 which, as described above, serve to configure the buffer transistors 330 and 334 to function as a clamp in the ESD protection circuit 510. The presence of other circuitry hanging on the gates of transistors 330 and 334 can be a potential problem for the effective operation of the ESD protection circuit 510. It is important that the transistors 576 and 578 have full and exclusive control over the gates of transistors 3303 and 334 when an ESD event occurs.

FIG. 6 further shows that the amplifier 602 receives the signals TRP and TRN. In response to active TRP and TRN signals (i.e., active in a detected ESD event), the amplifier 602 is disable from operation (for example, placed in a high impedance output state). This is important because the natural differential output characteristics of the amplifier, which would allow only one of transistors 330 and 334 to on at a time, will counteract the desired actions of the transistors 576 and 578 to turn both of transistors 330 and 334 on at the same time.

FIG. 6 further illustrates a level shifter circuit 610 which receives the signals TRP and TRP. In response to active TRP and TRN signals (i.e., active in a detected ESD event), the level shifter generates boosted STB and STB_B control signals which are applied to the gates of standby transistors 606 and 608. These boosted gate signals ensure that standby transistors 606 and 608 are fully turned off. This is important because the transistors 576 and 578 will be active during an ESD event trying to drive the gates of transistors 330 and 334 to the opposite rail from the transistors 606 and 608. During an ESD event, the level shifter 610 ensures that the signal STB is at VDD level (i.e., voltage source level) and the signal STB_B is at VSS level (i.e., ground level). When the signal TRN is greater than one voltage threshold above ground, the gate terminal of transistor 330 is pulled to ground, and simultaneously, when TRP is one voltage threshold less than VDD, the gate terminal of transistor 334 is charged to VDD, thereby turning ON both of the transistors 408 and 412 to sink the ESD.

Figure 7:
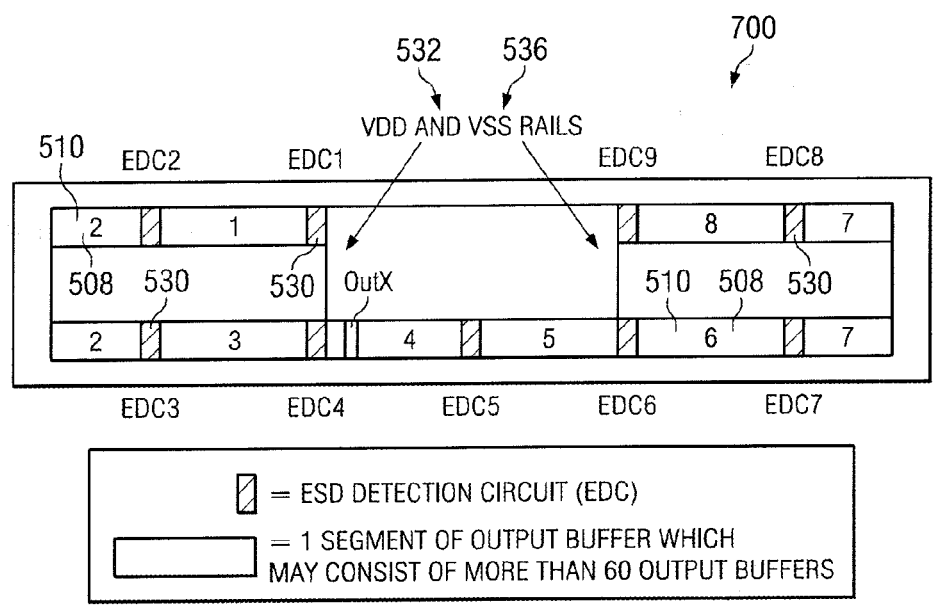
FIG. 7 illustrates a die with a plurality of segments of output buffers functioning also as ESD protection circuits.

Reference is now made to FIG. 7 which illustrates a die 700 in which segments of output buffers (1-8) are formed. Each segment 1-8 is formed of a plurality of output buffers 508 which additionally function as ESD protection circuits 510. In one implementation, a plurality of ESD detection circuits 530 are placed between adjacent segments 1-8 of output buffers 508/510. Any one of the included ESD detection circuits 530 can detect and ESD event. Furthermore, any one of the included ESD detection circuits 530 can, in response to a detected ESD event, trigger the actuation of the ESD protection circuits 510 for all of the included buffers 508.

Each segment of output buffers 1-8 contains a plurality of output buffer circuits 508 (e.g., 60 output buffers per segment). The output buffer circuits 508 are coupled between the voltage source rail 532 (for example, VDD) and the ground rail 536 (for example, VSS). Each of the ESD detection circuits 530 (EDC1-EDC9) is placed between two adjacent segments 1-8 of output buffers. For example, EDC2 is placed between segments 1 and 2 and EDC6 is placed between segments 5 and 6. If an ESD event occurs at the output buffer OutX, the nearest ESD protection circuit (i.e., EDC4) will trigger all of the output buffers 1-8 to sink the ESD by simultaneously turning on both of the buffer transistors 330 and 334.

In one implementation, the ESD detection circuits 530 all share common TRP and TRN signals, and thus one trigger from any circuit 530 causes all buffers 508/510 to provide ESD protection. However, the ESD detection circuits 530 can be implemented so that each triggers a separate section of ESD protection circuits 510.

It should be noted that the size of the output buffers (formed by transistors 330 and 334) is chosen carefully so that when all of the buffers are activated in ESD protection mode (reference 510) the equivalent resistance of (Ron) of all of the series source/drain paths of transistors 330 and 334 comparable to a certain number of large NMOS clamp transistors (see, reference 220). If this design is made, then the transistors 330 and 334 have the same current sinking capability of those large NMOS clamp transistors, and those NMOS clamps can be eliminated from the circuit implementation.

Although the drawings primarily indicate output buffers, it will be recognized that the controlled buffer transistors associated with providing ESD protection could alternatively comprise CMOS transistors associated with an input buffer.

It will also be appreciated that one or more of the elements depicted in the drawings/figures can also be implemented in a more separated or integrated manner, or even removed or rendered as inoperable in certain cases, as is useful in accordance with a particular application. It is also within the spirit and scope of the present invention to implement a program or code that can be stored in a machine-readable medium to permit a computer to perform any of the methods described above.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

The foregoing description of illustrated embodiments of the present invention, including what is described in the Abstract, is not intended to be exhaustive or to limit the invention to the precise forms disclosed herein. While specific embodiments of, and examples for, the invention are described herein for illustrative purposes only, various equivalent modifications are possible within the spirit and scope of the present invention, as those skilled in the relevant art will recognize and appreciate. As indicated, these modifications may be made to the present invention in light of the foregoing description of illustrated embodiments of the present invention and are to be included within the spirit and scope of the present invention.

Thus, while the present invention has been described herein with reference to particular embodiments thereof, a latitude of modification, various changes and substitutions are intended in the foregoing disclosures, and it will be appreciated that in some instances some features of embodiments of the invention will be employed without a corresponding use of other features without departing from the scope and spirit of the invention as set forth. Therefore, many modifications may be made to adapt a particular situation or material to the essential scope and spirit of the present invention. It is intended that the invention not be limited to the particular terms used in following claims and/or to the particular embodiment disclosed as the best mode contemplated for carrying out this invention, but that the invention will include any and all embodiments and equivalents falling within the scope of the appended claims. Thus, the scope of the invention is to be determined solely by the appended claims.

What is claimed is:

1. A circuit comprising:
    a CMOS output buffer coupled between a first supply rail and a second supply rail;
    an ESD detection circuit configured to detect an ESD event and generate an event signal;
    a control circuit operable responsive to the event signal to activate the CMOS output buffer to connect the first supply rail to the second supply rail to discharge the ESD event;
    wherein the CMOS output buffer comprises a PMOS transistor and an NMOS transistor connected in series between the first supply rail and the second supply rail, and wherein the control circuit comprises circuitry configured to simultaneously activate the PMOS and NMOS transistors to connect the first supply rail to the second supply rail;
    an amplifier with differential outputs coupled to gates of the PMOS and NMOS transistors, the control circuit further comprising circuitry configured to disable the amplifier in response to the ESD event signal;
    a first standby transistor having a source-drain circuit coupled between the first supply rail and a gate of the PMOS transistor; and
    a second standby transistor having a source-drain circuit coupled between the second supply rail and a gate of the NMOS transistor;
    the control circuit further comprising circuitry configured to shut off the first and second standby transistors in response to the ESD event signal.

2. The circuit of claim 1 wherein disabling the amplifier comprises placing the differential outputs coupled to gates of the PMOS and NMOS transistors in a high impedance output state.

3. The circuit of claim 1, the circuitry of the control circuit further operable to permit turning on of the first and second standby transistors in the absence of the ESD event signal to configure the CMOS output buffer in a standby mode.

4. A circuit comprising:
    a plurality of CMOS output buffers coupled between a first supply rail and a second supply rail;
    an ESD detection circuit configured to detect an ESD event and generate an event signal; and
    a control circuit operable responsive to the event signal to generate first and second control signals applied to each of the plurality of CMOS output buffers to simultaneously activate all of the plurality of CMOS output buffers to connect the first supply rail to the second supply rail to discharge the ESD event;
    wherein each CMOS output buffer comprises a PMOS transistor and an NMOS transistor connected in series between the first supply rail and the second supply rail, and wherein the first and second control signals are configured to simultaneously activate the PMOS and NMOS transistors in each of the plurality of CMOS output buffers to connect the first supply rail to the second supply rail; and
    an amplifier associated with each CMOS output buffer, the amplifier having differential outputs coupled to gates of the PMOS and NMOS transistors of the output buffer, the control circuit further comprising circuitry operable to disable the amplifier in response to the ESD event signal; and for each CMOS output buffer, a first standby transistor having a source-drain circuit coupled between the first supply rail and a gate of the PMOS transistor, and a second standby transistor having a source-drain circuit coupled between the second supply rail and a gate of the NMOS transistor, and the control circuit further comprising circuitry operable to shut off the first and second standby transistors in response to the ESD event signal.

5. The circuit of claim 4 wherein disabling the amplifier comprises placing the differential outputs coupled to gates of the PMOS and NMOS transistors of the output buffer in a high impedance output state.

6. A circuit comprising:
a plurality of CMOS output buffers coupled between a first supply rail and a second supply rail;
a plurality of ESD detection circuits each configured to detect an ESD event and generate an event signal; and
a control circuit operable responsive to the event signal from any one of the plurality of ESD detection circuits to generate first and second control signals applied to each of the plurality of CMOS output buffers to simultaneously activate all of the plurality of CMOS output buffers to connect the first supply rail to the second supply rail to discharge the ESD event;
wherein each CMOS output buffer comprises a PMOS transistor and an NMOS transistor connected in series between the first supply rail and the second supply rail, and wherein the first and second control signals are configured to simultaneously activate the PMOS and NMOS transistors in each of the plurality of CMOS output buffers to connect the first supply rail to the second supply rail; and
an amplifier associated with each CMOS output buffer, the amplifier having differential outputs coupled to gates of the PMOS and NMOS transistors of the output buffer, the control circuit further comprising circuitry operable to disable the amplifier in response to the ESD event signal; and
for each CMOS output buffer, a first standby transistor having a source-drain circuit coupled between the first supply rail and a gate of the PMOS transistor, and a second standby transistor having a source-drain circuit coupled between the second supply rail and a gate of the NMOS transistor, and the control circuit further comprising circuitry operable to shut off the first and second standby transistors in response to the ESD event signal.

7. The circuit of claim 6 wherein disabling the amplifier comprises placing the differential outputs coupled to gates of the PMOS and NMOS transistors of the output buffer in a high impedance output state.

8. A circuit comprising:
a plurality of CMOS output buffers coupled between a first supply rail and a second supply rail;
an ESD detection circuit configured to detect an ESD event and generate an event signal; and
a control circuit operable responsive to the event signal to generate first and second control signals applied to each of the plurality of CMOS output buffers to simultaneously activate all of the plurality of CMOS output buffers to connect the first supply rail to the second supply rail to discharge the ESD event;
wherein each CMOS output buffer comprises a PMOS transistor and an NMOS transistor connected in series between the first supply rail and the second supply rail, and wherein the first and second control signals are configured to simultaneously activate the PMOS and NMOS transistors in each of the plurality of CMOS output buffers to connect the first supply rail to the second supply rail; and
an amplifier associated with each CMOS output buffer, the amplifier having differential outputs coupled to gates of the PMOS and NMOS transistors of the output buffer, the control circuit further comprising circuitry operable to disable the amplifier in response to the ESD event signal; and
for each CMOS output buffer, a first standby transistor having a source-drain circuit coupled between the first supply rail and a gate of the PMOS transistor, and a second standby transistor having a source-drain circuit coupled between the second supply rail and a gate of the NMOS transistor, and the control circuit further comprising circuitry operable to permit turning on of the first and second standby transistors in the absence of the ESD event signal to configure the CMOS output buffer in a standby mode and further ensure full shut off the first and second standby transistors in response to the ESD event signal.

9. A circuit comprising:
a plurality of CMOS output buffers coupled between a first supply rail and a second supply rail;
a plurality of ESD detection circuits each configured to detect an ESD event and generate an event signal; and
a control circuit operable responsive to the event signal from any one of the plurality of ESD detection circuits to generate first and second control signals applied to each of the plurality of CMOS output buffers to simultaneously activate all of the plurality of CMOS output buffers to connect the first supply rail to the second supply rail to discharge the ESD event;
wherein each CMOS output buffer comprises a PMOS transistor and an NMOS transistor connected in series between the first supply rail and the second supply rail, and wherein the first and second control signals are configured to simultaneously activate the PMOS and NMOS transistors in each of the plurality of CMOS output buffers to connect the first supply rail to the second supply rail; and
an amplifier associated with each CMOS output buffer, the amplifier having differential outputs coupled to gates of the PMOS and NMOS transistors of the output buffer, the control circuit further comprising circuitry operable to disable the amplifier in response to the ESD event signal; and
for each CMOS output buffer, a first standby transistor having a source/drain circuit coupled between the first supply rail and a gate of the PMOS transistor, and a second standby transistor having a source/drain circuit coupled between the second supply rail and a gate of the NMOS transistor, and the control circuit further comprising circuitry operable to permit turning on of the first and second standby transistors in the absence of the ESD event signal to configure the CMOS output buffer in a standby mode and further ensure full shut off the first and second standby transistors in response to the ESD event signal.

* * * * *

UNITED STATES PATENT AND TRADEMARK OFFICE
CERTIFICATE OF CORRECTION

PATENT NO.       : 8,705,217 B2
APPLICATION NO.  : 12/343746
DATED            : April 22, 2014
INVENTOR(S)      : Yannick Guedon et al.

Page 1 of 1

It is certified that error appears in the above-identified patent and that said Letters Patent is hereby corrected as shown below:

On the Title Page:

(73)    Assignee should read:    STMicroelectronics Asia Pacific Pte Ltd, Singapore (SG);
        and STMicroelectronics S.r.l., (Agrate Brianza (MB), IT Signed and Sealed this
Twenty-fifth Day of August, 2015

Michelle K. Lee
*Director of the United States Patent and Trademark Office*